(12) United States Patent
North et al.

(10) Patent No.: US 9,910,459 B2
(45) Date of Patent: Mar. 6, 2018

(54) THERMAL INSULATOR AND RADIATION SHIELD

(71) Applicant: Dell Products L.P., Round Rock, TX (US)

(72) Inventors: Travis C. North, Cedar Park, TX (US); Austin Michael Shelnutt, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 299 days.

(21) Appl. No.: 14/664,452

(22) Filed: Mar. 20, 2015

(65) Prior Publication Data

US 2016/0274624 A1 Sep. 22, 2016

(51) Int. Cl.
| | | |
|---|---|---|
| *G06F 1/00* | (2006.01) | |
| *G06F 1/16* | (2006.01) | |
| *G06F 1/20* | (2006.01) | |
| *H05K 7/20* | (2006.01) | |

(52) U.S. Cl.
CPC ............ *G06F 1/1656* (2013.01); *G06F 1/203* (2013.01); *H05K 7/20* (2013.01)

(58) Field of Classification Search
None
See application file for complete search history.

(56) References Cited

U.S. PATENT DOCUMENTS

| | | | | |
|---|---|---|---|---|
| 5,880,930 A * | 3/1999 | Wheaton | ............ | H05K 7/20409 165/80.3 |
| 5,910,524 A * | 6/1999 | Kalinoski | ............... | F16J 15/064 427/387 |
| 6,242,690 B1 * | 6/2001 | Glover | ................. | H05K 9/0037 174/367 |
| 6,992,889 B1 * | 1/2006 | Kashiwagi | .......... | H01L 23/3675 165/104.33 |
| 7,000,686 B2 * | 2/2006 | Makino | ................. | F28D 15/043 165/104.21 |
| 2005/0157452 A1 * | 7/2005 | Ohmi | ................... | F28D 15/0233 361/676 |
| 2007/0068654 A1 * | 3/2007 | Chang | ................. | F28D 15/0233 165/104.21 |
| 2014/0085911 A1 * | 3/2014 | Zhang | ................... | H01L 23/373 362/382 |

* cited by examiner

*Primary Examiner* — Dimary Lopez Cruz
*Assistant Examiner* — Zhengfu Feng
(74) *Attorney, Agent, or Firm* — Jackson Walker L.L.P.

(57) ABSTRACT

In accordance with embodiments of the present disclosure, an apparatus for minimizing heat transfer may include a first member substantially planar in shape, a second member substantially planar in shape and substantially perpendicular to the first member, and a gasket mechanically coupling the first member to the second member. The apparatus may be formed such that the first member, second member, and the gasket define a plenum wherein the first member, the second member, and the gasket prevent transfer of fluid between an interior and exterior of the plenum.

18 Claims, 9 Drawing Sheets

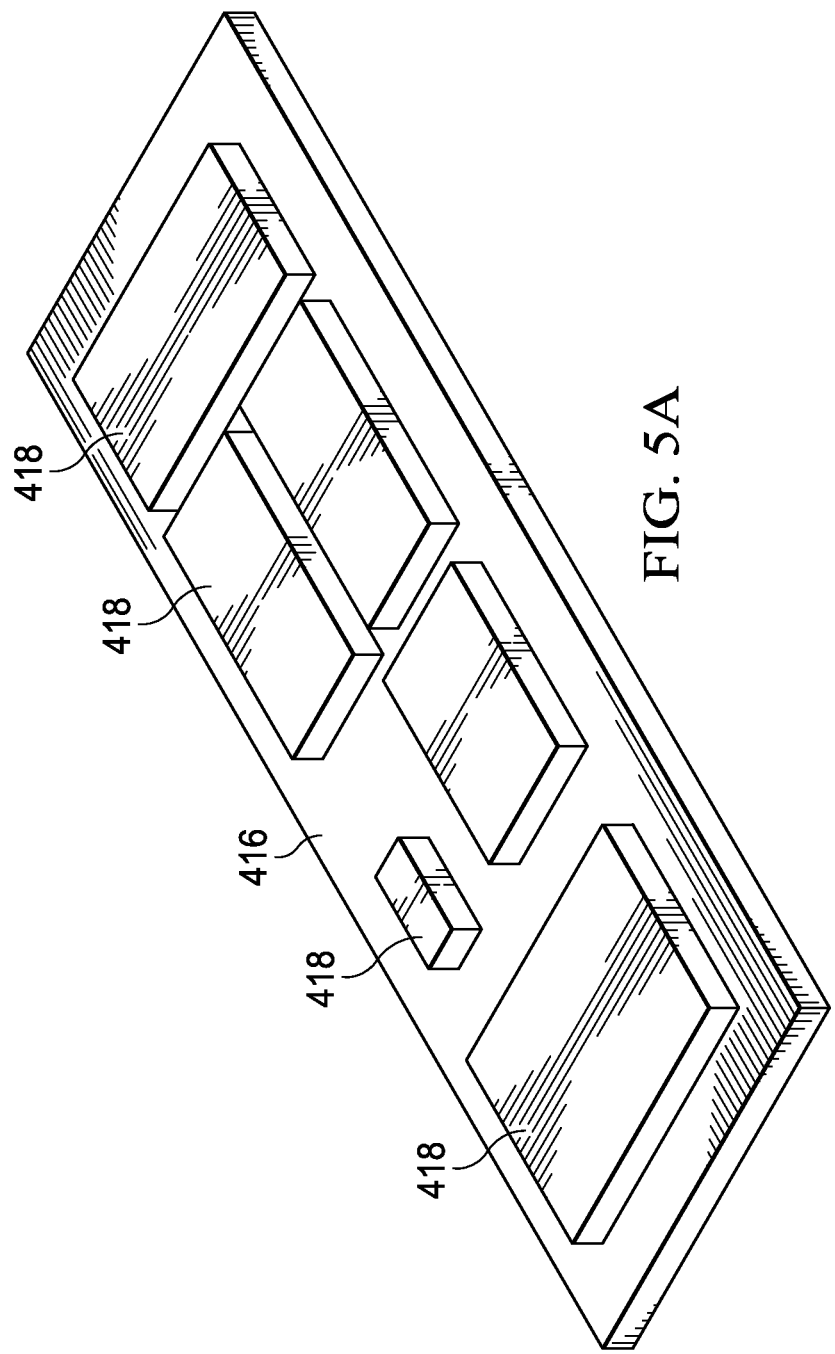

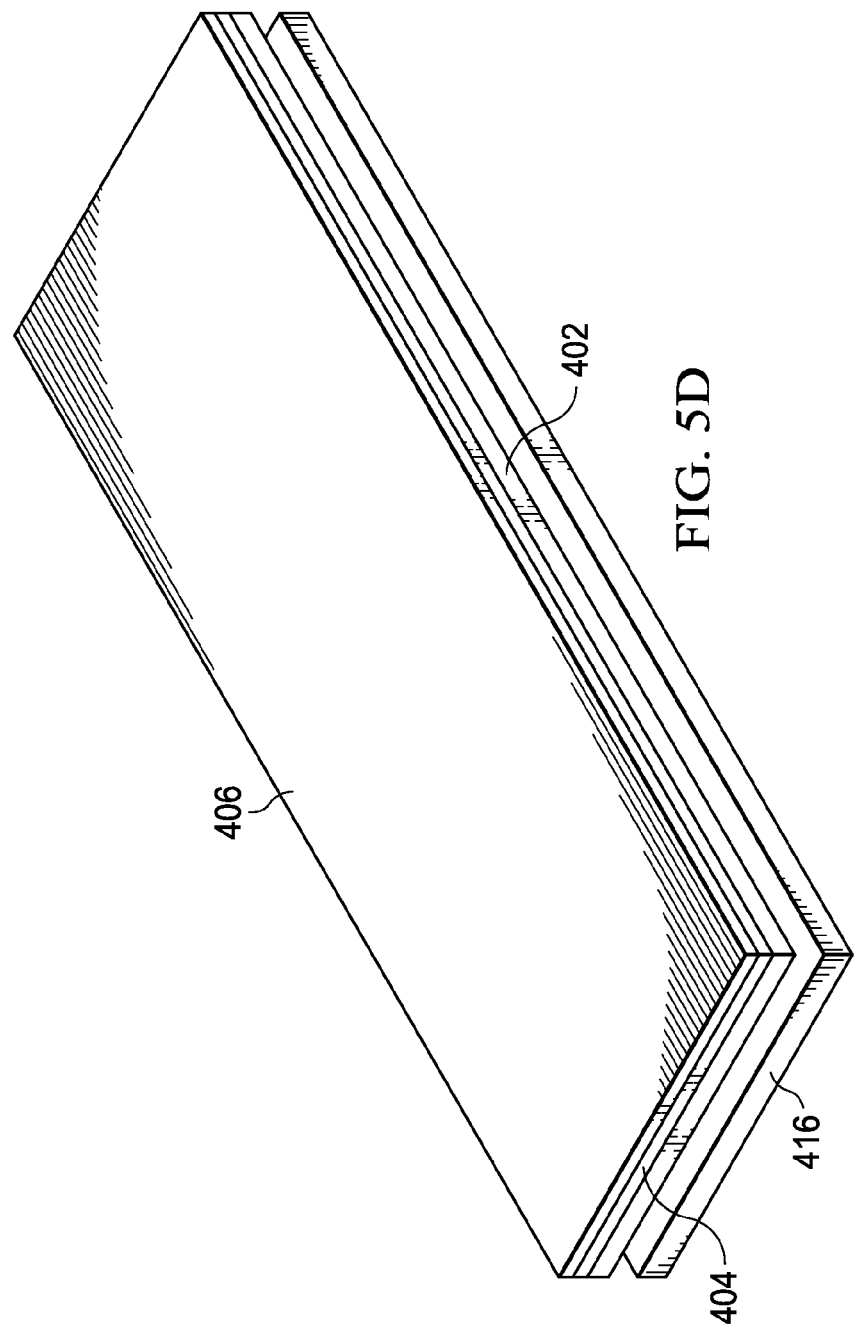

THERMAL INSULATOR AND RADIATION SHIELD

TECHNICAL FIELD

The present disclosure relates in general to information handling systems, and more particularly to thermal management in an information handling system using a thermal convection and radiation shield.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Such heat may be absorbed by other components of an information handling system, including an enclosure of the information handling system. As a result, an information handling system enclosure may reach a temperature that may become unsafe or uncomfortable for a user to handle, particularly for notebooks, laptops, handheld devices, and similar devices which are often used while being held by a user. For example, in some instances it is desirable to maintain a temperature of an information handling system enclosure below 55° C. for purposes of user comfort. Accordingly, systems and methods for minimizing heat transfer between heat-producing components of an information handling system and an enclosure thereof are desirable.

SUMMARY

In accordance with the teachings of the present disclosure, the disadvantages and problems associated with heat transfer from information handling resources of an information handling system and an enclosure thereof may be substantially reduced or eliminated.

In accordance with embodiments of the present disclosure, an apparatus for minimizing heat transfer may include a first member substantially planar in shape, a second member substantially planar in shape and substantially parallel to the first member, and a gasket mechanically coupling the first member to the second member. The apparatus may be formed such that the first member, second member, and the gasket define a plenum wherein the first member, the second member, and the gasket prevent transfer of fluid between an interior and exterior of the plenum.

In accordance with these and other embodiments of the present disclosure, a method may include mechanically coupling, via a gasket, a first member substantially planar in shape to a second member substantially planar in shape and substantially parallel to the first member such that the first member, second member, and the gasket define a plenum wherein the first member, the second member, and the gasket prevent transfer of fluid between an interior and exterior of the plenum.

In accordance with these and other embodiments of the present disclosure, an information handling system may include an enclosure, at least one information handling resource housed within the enclosure, and an assembly housed within the enclosure for minimizing heat transfer between the at least one information handling resource and the enclosure. The assembly may include a first member substantially planar in shape, a second member substantially planar in shape and substantially parallel to the first member, and a gasket mechanically coupling the first member to the second member. The assembly may be formed such that the first member, second member, and the gasket define a plenum wherein the first member, the second member, and the gasket prevent transfer of fluid between an interior and exterior of the plenum.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 5A-5F illustrate isometric views depicting formation of the various components of an example thermal insulator and radiation shield assembly, in accordance with embodiments of the present disclosure.

DETAILED DESCRIPTION

Figure 1:
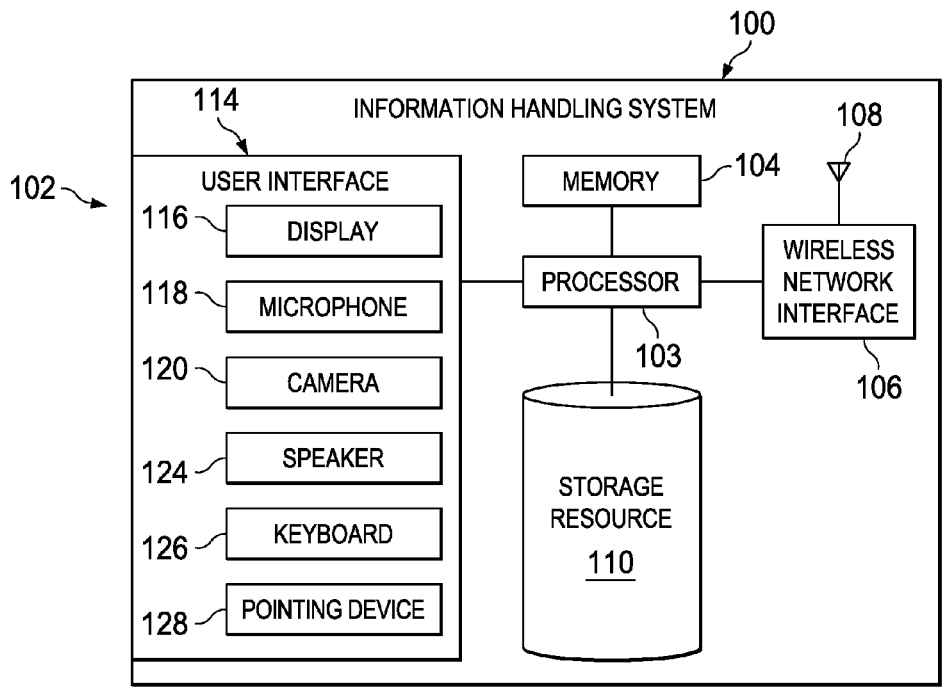
FIG. 1 illustrates a block diagram of an example information handling system, in accordance with embodiments of the present disclosure.

Preferred embodiments and their advantages are best understood by reference to FIGS. 1 through 5F, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages, electro-mechanical devices (e.g., air movers), displays, and power supplies.

For the purposes of this disclosure, a circuit board may broadly refer to a printed circuit board (PCB), printed wiring board (PWB), printed wiring assembly (PWA) etched wiring board, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of an example information handling system 102, in accordance with the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a mobile device sized and shaped to be readily transportable on the person of a user (e.g., a mobile phone, tablet, personal digital assistant, digital music player, etc.). In yet other embodiments, information handling system 102 may comprise a storage enclosure configured to house a plurality of physical disk drives and/or other computer-readable media for storing data.

As depicted in FIG. 1, information handling system 102 may include an enclosure 100 housing a plurality of information handling resources including, without limitation, a processor 103, a memory 104 communicatively coupled to processor 103, a storage resource 110 communicatively coupled to processor 103, a wireless network interface 106 communicatively coupled to processor 103, a user interface 114 communicatively coupled to processor 103, and an antenna 108 coupled to wireless network interface 106.

Enclosure 100 may include any structure or aggregation of structures that serves as a container for one or more information handling systems and information handling resources, and may be constructed from steel, aluminum, plastic, and/or any other suitable material. Although the term "enclosure" is used, enclosure 100 may also be referred to as a case, cabinet, tower, box, chassis, and/or housing. In some embodiments, chassis 100 may be configured to hold and/or provide power to a plurality of information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104, storage resource 110, and/or another component of information handling system 102.

Memory 104 may be communicatively coupled to processor 103 and may include any system, device, or apparatus configured to retain program instructions and/or data for a period of time (e.g., computer-readable media). Memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its associated information handling system 102 is turned off.

Wireless network interface 106 may include any suitable system, apparatus, or device operable to serve as an interface between its associated information handling system 102 and a network, such that information handling system 102 may communicate signals to and from wireless network interface 106 via wireless transmissions (e.g., mobile telephony, Wi-Fi, Bluetooth, mobile broadband telephony). Accordingly, wireless network interface 106 may include a radio-frequency transceiver and/or other components configured to communicate to and from wireless network interface 106 via wireless transmissions.

Antenna 108 may comprise any system, device, or apparatus configured to convert electric power into radio waves, and vice versa.

Storage resource 110 may include a system, device, or apparatus configured to store data. Storage resource 110 may include one or more hard disk drives, magnetic tape libraries, optical disk drives, magneto-optical disk drives, solid state storage drives, compact disk drives, compact disk arrays, disk array controllers, and/or any other systems, apparatuses or devices configured to store data. In certain embodiments, storage resource 110 may include one or more storage enclosures configured to hold and/or power one or more of such devices. In the embodiments represented by FIG. 1, storage resource 110 may reside within information handling system 102. However, in other embodiments, storage resource 110 may reside external to information handling system 102 (e.g., may be coupled to information handling system 102 via a network).

User interface 114 may comprise any instrumentality or aggregation of instrumentalities by which a user may interact with information handling system 102. For example, user interface 114 may permit a user to input data and/or instructions into information handling system 102 (e.g., via a keypad, keyboard, touch screen, microphone, camera, and/or other data input device), and/or otherwise manipulate information handling system 102 and its associated components. User interface 114 may also permit information handling system 102 to communicate data to a user (e.g., via a display device, speaker, and/or other data output device). As shown in FIG. 1, user interface 114 may include one or more of a display 116, microphone 118, camera 120, speaker 124, keyboard 126, and pointing device 128.

Display 116 may comprise any suitable system, device, or apparatus configured to display human-perceptible graphical data and/or alphanumeric data to a user. For example, in some embodiments, display 116 may comprise a liquid crystal display.

Microphone 118 may comprise any system, device, or apparatus configured to convert sound incident at microphone 118 to an electrical signal that may be processed by processor 103. In some embodiments, microphone 118 may include a capacitive microphone (e.g., an electrostatic microphone, a condenser microphone, an electret microphone, a microelectromechanical systems (MEMs) microphone, etc.) wherein such sound is converted to an electrical signal using a diaphragm or membrane having an electrical capacitance that varies as based on sonic vibrations received at the diaphragm or membrane.

Camera 120 may comprise any system, device, or apparatus configured to record images (moving or still) into one or more electrical signals that may be processed by processor 103.

Speaker 124 may comprise any system, device, or apparatus configured to produce sound in response to electrical audio signal input.

Keyboard 126 may include any typewriter-style device, which uses an arrangement of buttons and/or keys which may be manipulated by fingers of a user, to act as mechanical levers and/or electronic switches to input data to information handling system 102.

Pointing device 128 may include any suitable system, apparatus, or device configured to detect two-dimensional motion relative to a surface, wherein such motion is typically translated into the motion of a pointer on a display, allowing for fine control of a graphical user interface. Examples of a pointing device 128 include a mouse and a trackpad.

In addition to processor 103, memory 104, wireless network interface 106, antenna 108, storage resource 110, and user interface 114, information handling system 102 may include one or more other information handling resources. Such an information handling resource may include any component system, device or apparatus of an information handling system, including without limitation, a processor, bus, memory, I/O device and/or interface, storage resource (e.g., hard disk drives), network interface, electromechanical device (e.g., fan), display, power supply, and/or any portion thereof. An information handling resource may comprise any suitable package or form factor, including without limitation an integrated circuit package or a printed circuit board having mounted thereon one or more integrated circuit packages.

Figure 2:
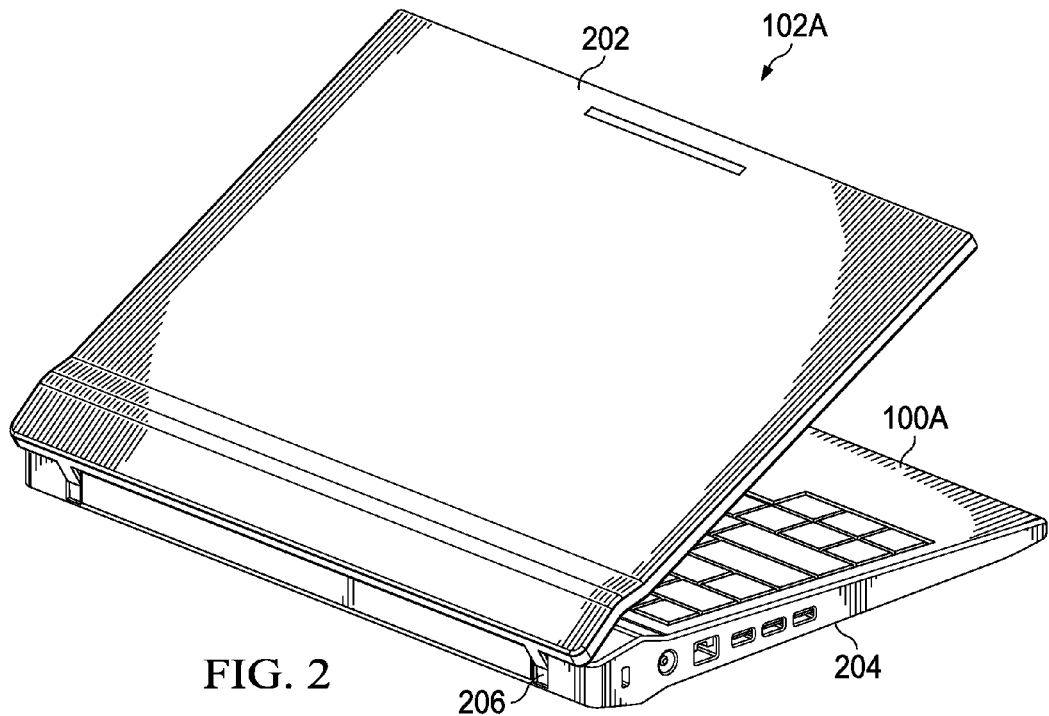
FIG. 2 illustrates an exterior view of an example information handling system embodied as a notebook or laptop computer, in accordance with embodiments of the present disclosure.

FIG. 2 illustrates an exterior view of example information handling system 102A embodied as a notebook or laptop computer, in accordance with embodiments of the present disclosure. As depicted in FIG. 2, information handling system 102A may include a display assembly 202 (which may house display 116 and/or other information handling resources) and a keyboard assembly 204 (which may house keyboard 126, pointing device 128, and/or other information handling resources) hingedly coupled via one or more hinges 206. Each of display assembly 202 and keyboard assembly 204 may be integral parts of an enclosure 100A for information handling system 102A. Each of display assembly 202 and keyboard assembly 204 may have an enclosure made from one or more suitable materials, including without limitation plastic, steel, and/or aluminum. Although information handling system 102A is shown in FIG. 2 as having certain components (e.g., display assembly 202, keyboard assembly 204, and hinge 206), information handling system 102A may include any other suitable components which may not have been depicted in FIG. 2 for the purposes of clarity and exposition. In operation, information handling system 102A may be translated between a closed position (e.g., a position of display assembly 202 relative to keyboard assembly 204 such that display assembly 202 substantially overlays keyboard assembly 204, or vice versa) and an open position (e.g., a position of display assembly 202 relative to keyboard assembly 204 such that display assembly 202 does not substantially overlay keyboard assembly 204, or vice versa, such as when the angle formed by display assembly 202 and keyboard assembly 204 at hinge 206 is substantially non zero). In the embodiments shown in FIG. 2, a user may come in contact with many surfaces of display assembly 202 or keyboard assembly 204 that may absorb heat generated by information handling resources of information handling system 102A.

Figure 3B:
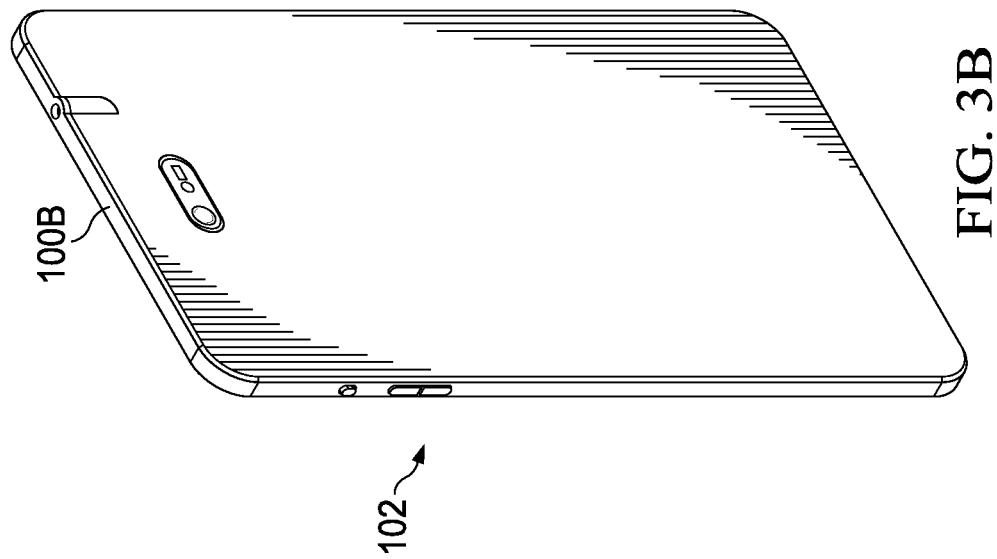
FIGS. 3A and 3B illustrate an exterior view of an example information handling system embodied as a mobile device, in accordance with embodiments of the present disclosure.
Figure 3A:
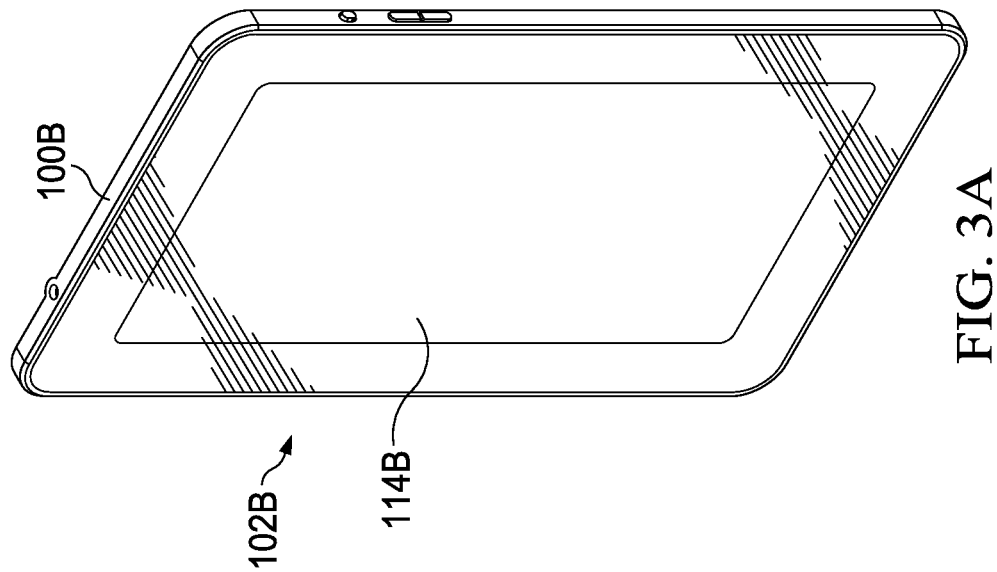

FIGS. 3A and 3B illustrate an exterior view of an example information handling system 102B embodied as a mobile device sized and shaped to be readily transportable on the person of a user (e.g., a mobile phone, tablet, personal digital assistant, digital music player, etc.), in accordance with embodiments of the present disclosure. As shown in FIGS. 3A and 3B, a front (FIG. 3A) of example information handling system 102B may include on the surface thereof a display 114B communicatively coupled to other information handling resources housed within enclosure 100B. In such embodiments, display 114B may include a touch sensor. As known in the art, such a touch sensor may include a system, device, or apparatus configured to detect tactile touches (e.g., by a human finger, a stylus, etc.) on the touch sensor and generate one or more signals indicative of the occurrence of such touches and/or the locations of such touches on the touch sensor. For example, a touch sensor may be a capacitive touch sensor configured to detect changes in capacitance induced by tactile touches. In these and other embodiments, a touch sensor may be constructed from substantially optically transparent material and placed over a liquid crystal display or another display apparatus of display 114B, allowing a user to view graphical elements of display 114B while interacting with the touch sensor. In the embodiments shown in FIGS. 3A and 3B, a user may come in contact with many surfaces of enclosure 100B (e.g., the reverse of enclosure 100B shown in FIG. 3B which may rest in a user's hand during use) that may absorb heat generated by information handling resources of information handling system 102B.

Although FIGS. 2, 3A, and 3B depict information handling system 102A as a laptop or notebook computer and information handling system 102B as a mobile device sized and shaped to be readily transported and carried on a person of a user of information handling system 102B, an information handling system 102 may comprise any type of information handling system (e.g., a desktop computer, a tower computer, a server, storage enclosure, etc.), and methods and systems disclosed, described, and claimed herein may not be limited to application in a laptop or notebook computer or to a mobile device. In addition, although FIG. 3A depicts an information handing system 102B as including a touch sensor, it is noted that information handling systems other than tablets and smart phone may include a touch-screen display having a touch sensor.

Figure 4:
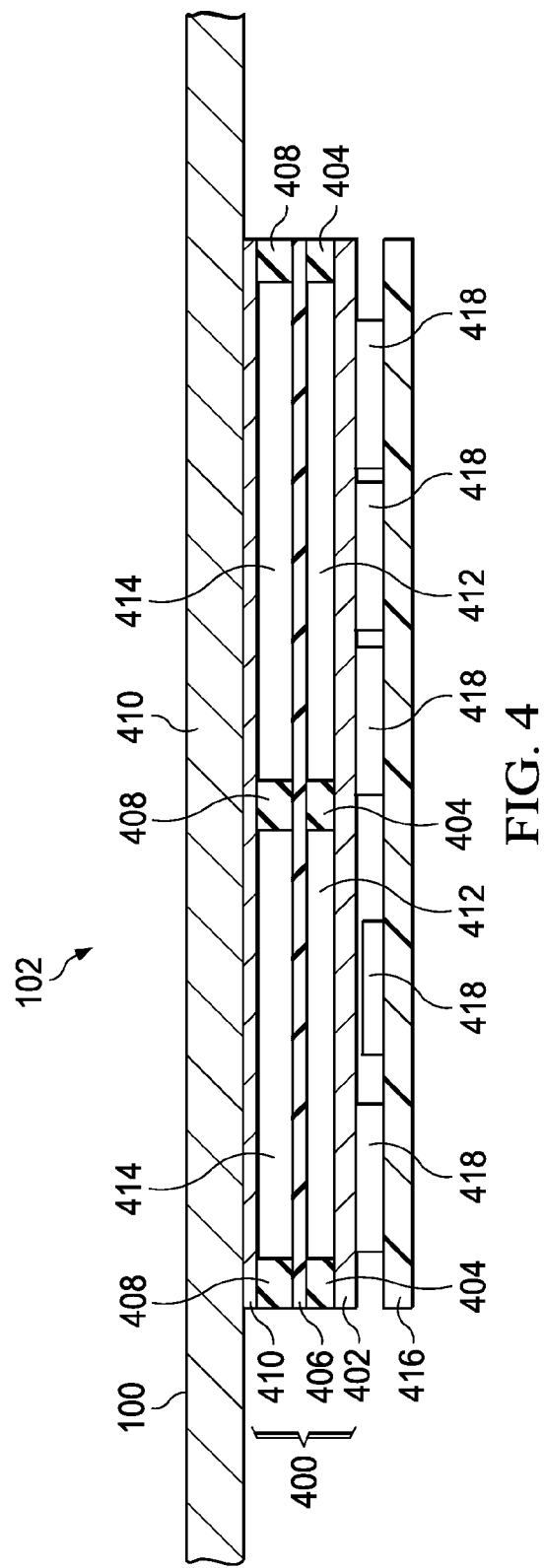
FIG. 4 illustrates an elevation view of a portion of an information handling system including an example thermal insulator and radiation shield assembly, in accordance with embodiments of the present disclosure.

FIG. 4 illustrates an elevation view of a portion of information handling system 102 including an example thermal insulator and radiation shield assembly 400, in accordance with embodiments of the present disclosure. As shown in FIG. 4, thermal insulator and radiation shield assembly 400 may be thermally coupled between a wall of an enclosure 100 and devices 418 disposed on a circuit board 416. Circuit board 416 and/or devices 418 may embody information handling resources of information handling system 102, including without limitation all or a part of one or more of the various information handling resources depicted in FIG. 1 (e.g., processor 103, memory 104, wireless network interface 106, storage resource 110, user interface 114).

As shown in FIG. 4, thermal insulator and radiation shield assembly 400 may include a substantially planar bottom layer member 402, a substantially planar intermediate layer member 406 generally parallel to bottom layer member 402, a substantially planer top layer member 410 generally parallel to bottom layer member 402, a gasket 404 mechanically coupled between bottom layer member 402 and intermediate layer member 406, and a gasket 408 mechanically coupled between top layer member 410 and intermediate layer member 406. As so constructed, thermal insulator and radiation shield assembly 400 may include one or more plenums 412 defined by a surface of bottom layer member 402, a surface of intermediate layer member 406, and an inner perimeter of gasket 404. Similarly, thermal insulator and radiation shield assembly 400 may include one or more plenums 414 defined by a surface of top layer member 410, a surface of intermediate layer member 406, and an inner perimeter of gasket 408.

Bottom layer member 402 may comprise any suitable material for providing the structure of bottom layer member 402 as described herein. Bottom layer member 402 may be mechanically coupled to devices 418 and/or circuit board 416 in any suitable manner, including without limitation adhesive, clamp, bracket, and/or fastener (e.g., screw, nut, bolt). In some embodiments, bottom layer member 402 may comprise a heat spreader or other heat exchanger configured to spread heat generated by devices 418 over the bulk of bottom layer member 402. Accordingly, in such embodiments, bottom layer member 402 may comprise a generally thermally conductive material (e.g., a material with conductivity of greater than approximately 80 watts per meter-Kelvin, such as copper, silver, gold, aluminum, steel).

Top layer member 410 may comprise any suitable material for providing the structure of top layer member 410 as described herein. In some embodiments, top layer member 410 may be oriented generally parallel to a wall or other surface of enclosure 100 and mechanically coupled thereto in any suitable manner, including without limitation adhesive, clamp, bracket, and/or fastener (e.g., screw, nut, bolt). In some embodiments, top layer member 410 may be substantially directly coupled to such wall or other surface of enclosure 100 (e.g., such that no appreciable air gap is formed between enclosure 100 and top layer member 410). In other embodiments, top layer member 410 may be coupled to enclosure 100 such that an air gap exists between top layer member 410 and enclosure 100. In some embodiments, top layer member 410 may comprise an electromagnetic radiation shield configured to reflect electromagnetic radiation generated by device 418 or other information handling resources of information handling system 102 (e.g., electromagnetic interference of electronic components, infrared energy, etc.) away from an inner surface of enclosure 100 to prevent such electromagnetic radiation from being converted to heat energy within enclosure 100. Accordingly, in such embodiments, top layer member 410 may comprise a material with high reflectivity of electromagnetic energy (e.g., aluminum, steel, copper, silver, gold, other metal).

Intermediate layer member 406 may comprise any suitable material for providing the structure of intermediate layer member 406 as described herein. In some embodiments, intermediate layer member 406 may comprise a thin layer of material suitable for creating a physical barrier to gaseous matter to define a boundary of one or more of plenums 412 and/or 414. In these and other embodiments, intermediate layer member 406 may comprise a generally thermally insulative material (e.g., a material with conductivity of lesser than approximately 5 watts per meter-Kelvin). Examples of materials that may be used for intermediate layer member 406 include, without limitation, a polyester film (e.g., biaxially-oriented polyethylene terephthalate, commonly known by its trade name MYLAR), compressed polystyrene, other suitable polymer, aerogel, and other materials suitable for being formed into thin solid films.

Gasket 404 may comprise any suitable material for providing the structure of gasket 404 as described herein. In some embodiments, gasket 404 may comprise a material suitable to adhere to each of bottom layer member 402 and intermediate layer member 406, while providing a fluid seal to prevent gaseous matter from being exchanged between an interior and an exterior of each of plenums 412, and having a height sufficient to provide adequate space between bottom layer member 402 and intermediate layer member 406 to create one or more plenums 412. In some embodiments, gasket 404 may be formed, from a perspective generally perpendicular to the elevation view perspective shown in FIG. 4, in one or more plane figures (e.g., an ellipse or polygon) such that a plenum 412 is bounded at its "bottom" by bottom layer member 402, at its "top" by intermediate layer member 406, and its lateral sides by gasket 404. Examples of materials that may be used for gasket 404 include, without limitation, silicone, rubber, and pour-on foam.

Gasket 408 may comprise any suitable material for providing the structure of gasket 408 as described herein. In some embodiments, gasket 408 may comprise a material suitable to adhere to each of top layer member 410 and intermediate layer member 406, while providing a fluid seal to prevent gaseous matter from being exchanged between an interior and an exterior of each of plenums 414, and having a height sufficient to provide adequate space between top layer member 410 and intermediate layer member 406 to create one or more plenums 414. In some embodiments, gasket 408 may be formed, from a perspective generally perpendicular to the elevation view perspective shown in FIG. 4, in one or more plane figures (e.g., an ellipse or polygon) such that a plenum 414 is bounded at its "top" by top layer member 410, at its "bottom" by intermediate layer member 406, and its lateral sides by gasket 408. Examples of materials that may be used for gasket 408 include, without limitation, silicone, rubber, and pour-on foam.

As described above, the structure of thermal insulator and radiation shield assembly 400 may define one or more plenums 412 and 414. In some embodiments, one or more of plenums 412 and 414 may comprise a vacuum substantially devoid of matter. In other embodiments, one or more of plenums 412 and 414 may comprise gaseous matter (e.g., air). In some embodiments, one or more of plenums 412 and 414 may be constructed within sufficiently small dimensions such that any natural draft of the gaseous matter within such plenum(s) is reduced or eliminated, which may ensure that heat transfer through the gaseous matter is primarily in the form of conduction and not convection. For example, to achieve such reduction or elimination in natural draft, plenum(s) 412 may be constructed to have a height of less than approximately 0.3 millimeters between bottom layer member 402 and intermediate layer member 406 and/or plenum(s) 414 may be constructed to have a height of less than approximately 0.3 millimeters between top layer member 410 and intermediate layer member 406.

Although FIG. 4 depicts thermal insulator and radiation shield assembly 400 having three "stacked" layers of material (e.g., bottom layer member 402, intermediate layer member 406, top layer member 410), thermal insulator and radiation shield assembly 400 may have any suitable number of stacked layers. For example, in some embodiments, one or more of bottom layer member 402, intermediate layer member 406, and top layer member 410 may be absent, such that only one row of plenums are interfaced between devices 418 and enclosure 100. As another example, in other embodiments, thermal insulator and radiation shield assembly 400 may include a plurality of intermediate layer members 406 coupled together and separated by gaskets in between such intermediate layer members 406 such that three or more rows of plenums are interfaced between devices 418 and enclosure 100 (e.g., a line perpendicular to bottom member 402 and originating from circuit board 416 may pass through any number of plenums as the line extends between circuit board 416 and enclosure 100).

Figure 5B:
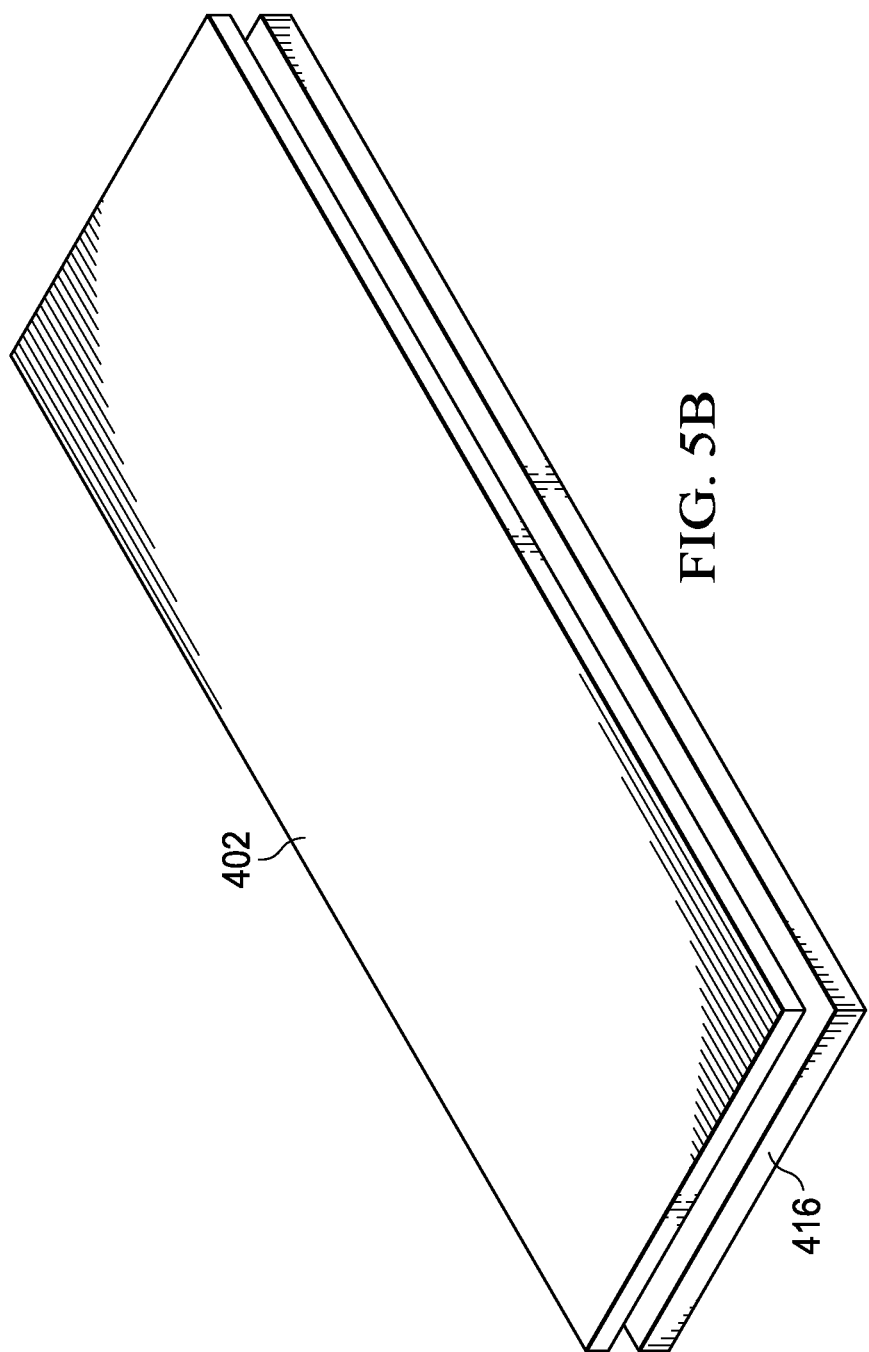

FIGS. 5A-5F illustrate isometric views depicting formation of the various components of example thermal insulator and radiation shield assembly 400, in accordance with embodiments of the present disclosure. In FIG. 5A, circuit board 416 including devices 418 is depicted. Thermal insulator and radiation shield assembly 400 may be coupled to circuit board 416 and/or devices 418, as described in greater detail below.

FIG. 5B depicts mechanical and/or thermal coupling of bottom layer member 402 to circuit board 416 and/or devices 418. In some embodiments, bottom layer member 402 may be mechanically coupled to circuit board 416 (e.g., via clamps, brackets, and/or fasteners) and/or devices 418 (e.g., via adhesives) so as to be in thermal communication with devices 418.

Figure 5C:
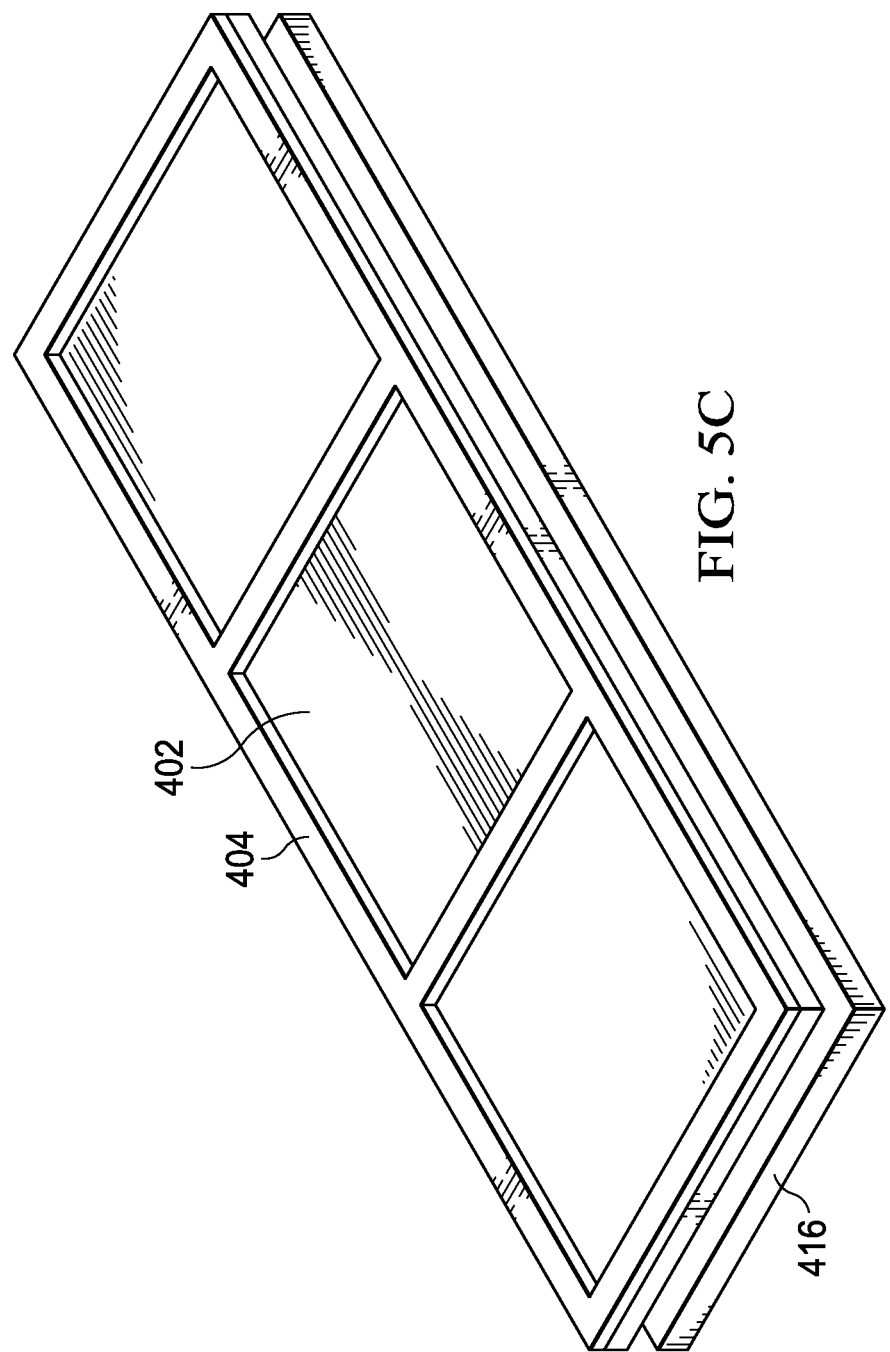

FIG. 5C depicts formation of gasket 404 on bottom layer member 402. As shown in FIG. 5C, gasket 404 may be formed on bottom layer member 402 in the shape of one or more plane figures (e.g., rectangles) such that when intermediate layer member 406 is placed on gasket 404, bottom layer member 402, gasket 404, and intermediate layer member 406 define one or more plenums 412.

FIG. 5D depicts placement of intermediate layer member 406 on gasket 404 such that intermediate layer member 406 is coupled to bottom layer member 402 via gasket 404.

Figure 5E:
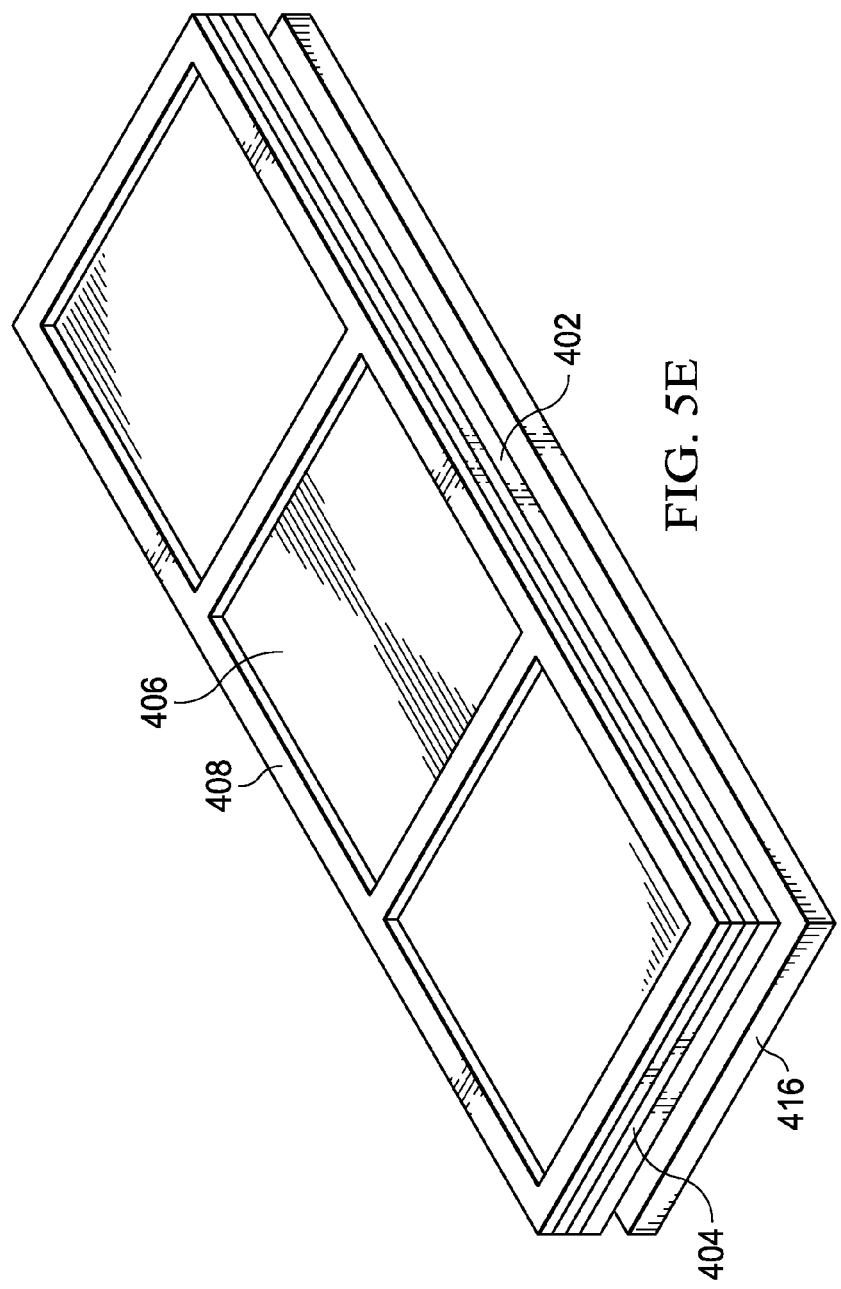

FIG. 5E depicts formation of gasket 408 on intermediate layer member 406. As shown in FIG. 5E, gasket 408 may be formed on intermediate layer member 406 in the shape of one or more plane figures (e.g., rectangles) such that when top layer member 410 is placed on gasket 408, top layer member 410, gasket 408, and intermediate layer member 406 define one or more plenums 414.

Figure 5F:
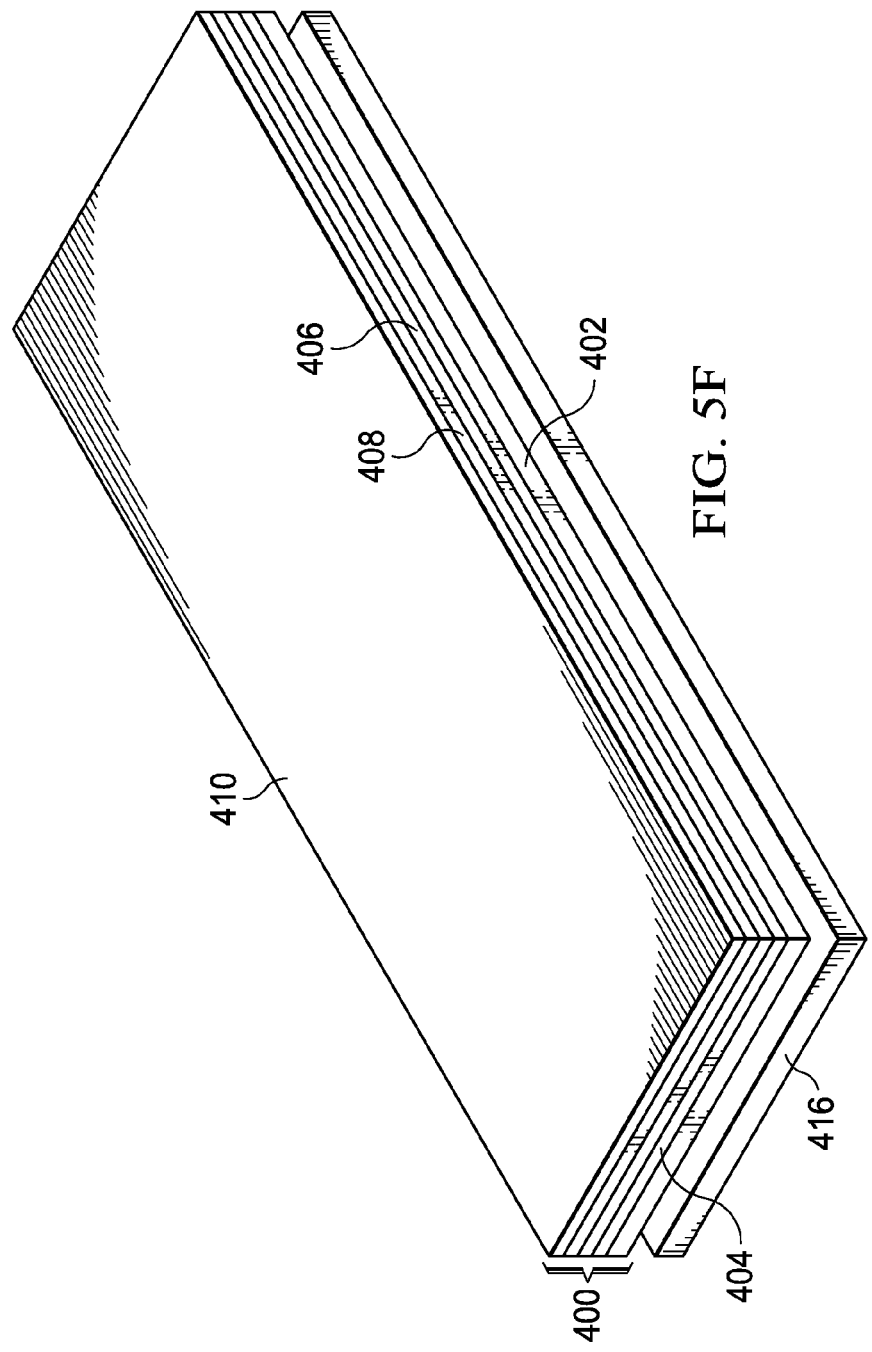

FIG. 5F depicts placement of top layer member 410 on gasket 408 such that top layer member 410 is coupled to intermediate layer member 406 via gasket 408, which may complete construction of thermal insulator and radiation shield assembly 400.

Although FIGS. 5A-5F depict a particular order of steps for construction of thermal insulator and radiation shield assembly 400, any other suitable order of steps may be undertaken to construct thermal insulator and radiation shield assembly 400. For example, in some embodiments, thermal insulator and radiation shield assembly 400 may be constructed in full and then coupled to circuit board 416 and/or devices 418. As another example, in other embodiments, thermal insulator and radiation shield assembly 400 may be constructed in an order opposite to that shown in FIGS. 5A-5F: gasket 408 may be formed on top layer member 410, intermediate layer member 406 may be placed on gasket 408, gasket 404 may be formed on intermediate layer member 406, and bottom layer member 402 may be placed on gasket 404. As a further example, gasket 404 and gasket 408 may be formed on opposite sides of intermediate layer member 406, bottom layer member 402 may be placed on gasket 404, and top layer member 410 may be placed on gasket 408.

As used herein, when two or more elements are referred to as "coupled" to one another, such term indicates that such two or more elements are in electronic communication, mechanical communication, or thermal communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An apparatus for minimizing heat transfer comprising:
a first member substantially planar in shape;
a second member substantially planar in shape and substantially parallel to the first member;
a gasket mechanically coupling the first member to the second member and formed such that the first member, second member, and the gasket define a plenum wherein the first member, the second member, and the gasket prevent transfer of fluid between an interior and exterior of the plenum;
a third member substantially planar in shape and substantially parallel to the first member, wherein the third member comprises an electromagnetic radiation shield configured to reflect electromagnetic radiation generated by one or more electronic devices; and
a second gasket mechanically coupling the third member to the second member and formed such that the third member, second member, and the second gasket define a second plenum wherein the third member, the second member, and the second gasket prevent transfer of fluid between an interior and exterior of the second gasket.

2. The apparatus of claim 1, wherein:
the first member comprises a generally thermally conductive material; and
the second member comprises a generally thermally insulative material.

3. The apparatus of claim 1, wherein:
the first member comprises a generally thermally conductive material; and
the second member comprises a generally thermally insulative material.

4. The apparatus of claim 1, the plenum comprising gaseous matter.

5. The apparatus of claim 4, wherein the plenum is constructed with dimensions such that heat transfer through the gaseous matter is primarily in the form of conduction through the gaseous matter as opposed to convection of the gaseous matter.

6. A method comprising:
mechanically coupling, via a gasket, a first member substantially planar in shape to a second member substantially planar in shape and substantially parallel to the first member such that the first member, second member, and the gasket define a plenum wherein the first member, the second member, and the gasket prevent transfer of fluid between an interior and exterior of the plenum; and
mechanically coupling, with a second gasket, a third member substantially planar in shape and substantially parallel to the first member and the second member and formed such that the third member, second member, and the second gasket define a second plenum wherein the third member, the second member, and the second gasket prevent transfer of fluid between an interior and exterior of the second gasket;
wherein the third member comprises an electromagnetic radiation shield configured to reflect electromagnetic radiation generated by one or more electronic devices.

7. The method of claim 6, wherein:
the first member comprises a generally thermally conductive material; and
the second member comprises a generally thermally insulative material.

8. The method of claim 6, wherein:
the first member comprises a generally thermally conductive material; and
the second member comprises a generally thermally insulative material.

9. The method of claim 6, the plenum comprising gaseous matter.

10. The method of claim 9, further comprising constructing the plenum with dimensions such that heat transfer through the gaseous matter is primarily in the form of conduction through the gaseous matter as opposed to convection of the gaseous matter.

11. An information handling system comprising:
an enclosure;
at least one information handling resource housed within the enclosure; and
an assembly housed within the enclosure for minimizing heat transfer between the at least one information handling resource and the enclosure comprising:
a first member substantially planar in shape;
a second member substantially planar in shape and substantially parallel to the first member;
a gasket mechanically coupling the first member to the second member and formed such that the first member, second member, and the gasket define a plenum wherein the first member, the second member, and the gasket prevent transfer of fluid between an interior and exterior of the plenum;
a third member substantially planar in shape and substantially parallel to the first member, wherein the third member comprises an electromagnetic radiation shield configured to reflect electromagnetic radiation generated by the at least one information handling resource; and
a second gasket mechanically coupling the third member to the second member and formed such that the third member, second member, and the second gasket define a second plenum wherein the third member, the second member, and the second gasket prevent transfer of fluid between an interior and exterior of the second gasket.

12. The information handling system of claim 11, wherein:
the first member comprises a generally thermally conductive material and is thermally coupled to the at least one information handling resource; and
the second member comprises a generally thermally insulative material.

13. The information handling system of claim 11, wherein:
the first member comprises a generally thermally conductive material and is thermally coupled to the at least one information handling resource; and
the second member comprises a generally thermally insulative material.

14. The information handling system of claim 11, the plenum comprising gaseous matter.

15. The information handling system of claim 14, wherein the plenum is constructed with dimensions such that heat transfer through the gaseous matter is primarily in the form of conduction through the gaseous matter as opposed to convection of the gaseous matter.

16. An apparatus for minimizing heat transfer comprising:
a first member substantially planar in shape;
a second member substantially planar in shape and substantially parallel to the first member; and
a gasket mechanically coupling the first member to the second member and formed such that the first member, second member, and the gasket define a plenum comprising gaseous matter wherein the first member, the second member, and the gasket prevent transfer of fluid between an interior and exterior of the plenum;
wherein the plenum is constructed with dimensions such that heat transfer through the gaseous matter is primarily in the form of conduction through the gaseous matter as opposed to convection of the gaseous matter.

17. A method comprising:
mechanically coupling, via a gasket, a first member substantially planar in shape to a second member substantially planar in shape and substantially parallel to the first member such that the first member, second member, and the gasket define a plenum comprising gaseous matter wherein the first member, the second member, and the gasket prevent transfer of fluid between an interior and exterior of the plenum; and
constructing the plenum with dimensions such that heat transfer through the gaseous matter is primarily in the form of conduction through the gaseous matter as opposed to convection of the gaseous matter.

18. An information handling system comprising:
an enclosure;
at least one information handling resource housed within the enclosure; and
an assembly housed within the enclosure for minimizing heat transfer between the at least one information handling resource and the enclosure comprising:
a first member substantially planar in shape;
a second member substantially planar in shape and substantially parallel to the first member;
a gasket mechanically coupling the first member to the second member and formed such that the first member, second member, and the gasket define a plenum comprising gaseous matter wherein the first member, the second member, and the gasket prevent transfer of fluid between an interior and exterior of the plenum;
wherein the plenum is constructed with dimensions such that heat transfer through the gaseous matter is primarily in the form of conduction through the gaseous matter as opposed to convection of the gaseous matter.

* * * * *